United States Patent
Ma

(10) Patent No.: US 9,824,750 B2
(45) Date of Patent: Nov. 21, 2017

(54) MEMORY SENSING

(71) Applicant: Empire Technology Development LLC, Wilmington, DE (US)

(72) Inventor: Yanjun Ma, Bellevue, WA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/630,644

(22) Filed: Feb. 24, 2015

(65) Prior Publication Data

US 2016/0247560 A1  Aug. 25, 2016

(51) Int. Cl.
| G11C 11/56 | (2006.01) |
| G11C 16/08 | (2006.01) |
| G11C 16/28 | (2006.01) |
| G11C 16/32 | (2006.01) |
| G11C 16/26 | (2006.01) |

(52) U.S. Cl.
CPC .......... *G11C 11/5642* (2013.01); *G11C 16/08* (2013.01); *G11C 16/26* (2013.01); *G11C 16/32* (2013.01); *G11C 16/28* (2013.01)

(58) Field of Classification Search
CPC ..... G11C 11/5642; G11C 16/08; G11C 16/28; G11C 16/32
See application file for complete search history.

(56) References Cited

U.S. PATENT DOCUMENTS

| 6,154,390 A | 11/2000 | Yang |
| 7,352,627 B2 | 4/2008 | Cohen |
| 7,623,373 B2 | 11/2009 | Barkley |
| 8,050,103 B2 * | 11/2011 | Kim .................... G11C 11/5628 365/185.22 |
| 8,179,724 B2 | 5/2012 | Chandrasekhar et al. |
| 8,289,779 B2 * | 10/2012 | Hoei .................... G11C 11/5642 365/185.03 |
| 2009/0141558 A1 * | 6/2009 | Sarin .................... G11C 11/5642 365/185.21 |
| 2010/0074014 A1 * | 3/2010 | Dunga ..................... G11C 7/04 365/185.17 |

(Continued)

OTHER PUBLICATIONS

Sharon, E., and Alrod, I., "Coding Scheme for Optimizing Random I/O Performance," arXiv:1202.6481 [cs.IT], pp. 1-5 (Feb. 29, 2012).

(Continued)

*Primary Examiner* — Tri Hoang
(74) *Attorney, Agent, or Firm* — Turk IP Law, LLC

(57) ABSTRACT

Technologies are generally described herein for technologies to sense the threshold voltage for memory cells in one sensing operation. The memory cells may be storage circuits for a flash memory device, such as a multilevel flash memory device. Data may be stored and retrieved in the memory cells of the flash memory without involving the use of hardwired or predetermined thresholds. According to some configurations, the sense time distribution from a set of flash cells (e.g., one row), may be processed to decode the digital state of each memory cell. In some examples, computer-executable instructions may be used to process and decode the digital state of the memory cells.

18 Claims, 8 Drawing Sheets

(56) References Cited

U.S. PATENT DOCUMENTS

| | | | |
|---|---|---|---|
| 2011/0222353 A1* | 9/2011 | Pabustan | G11C 16/26 365/185.19 |
| 2011/0258371 A1* | 10/2011 | Yang | G11C 11/5642 711/103 |
| 2014/0119113 A1* | 5/2014 | Xia | G11C 16/06 365/185.03 |
| 2014/0293696 A1* | 10/2014 | Lin | G11C 16/26 365/185.12 |
| 2015/0340086 A1* | 11/2015 | Filipiak | G11C 11/5642 365/185.03 |

OTHER PUBLICATIONS

Wang, J., et al., "LDPC Decoding with Limited-Precision Soft Information in Flash Memories," arXiv:1210.0149 [cs.IT], pp. 1-27 (Sep. 29, 2012).

Zhao, K., et al., "LDPC-in-SSD: Making Advanced Error Correction Codes Work Effectively in Solid State Drives," FAST'13 (11th Usenix conference on File and Storage Technologies), pp. 243-256 (Feb. 12-15, 2013).

\* cited by examiner

| CLK | Control gate | Sense amp Vout | | | | | | | | | | Reference Cell Vout | | | state |
|---|---|---|---|---|---|---|---|---|---|---|---|---|---|---|---|
| | | Cell0 | Cell1 | Cell2 | Cell3 | Cell4 | Cell5 | Cell6 | Cell7 | | | Ref1 (Vt=0.8V) | Ref2 (Vt=2.5V) | Ref3 (Vt=4.2V) | |
| Cycle | Vt | | | | | | | | | | | | | | |
| 1 | 0 | 0 | 0 | 0 | 0 | 0 | 0 | 0 | 0 | | | 0 | 0 | 0 | |
| 2 | 0.4 | 0 | 0 | 0 | 0 | 0 | 0 | 0 | 0 | | | 0 | 0 | 0 | |
| 3 | 0.8 | 1 | 0 | 0 | 0 | 0 | 0 | 0 | 0 | | | 1 | 0 | 0 | 11 |
| 4 | 1.2 | 1 | 0 | 0 | 0 | 0 | 0 | 0 | 0 | | | 1 | 0 | 0 | |
| 5 | 1.6 | 1 | 1 | 0 | 0 | 0 | 0 | 0 | 1 | | | 1 | 0 | 0 | |
| 6 | 2 | 1 | 1 | 0 | 0 | 0 | 0 | 0 | 1 | | | 1 | 0 | 0 | 01 |
| 7 | 2.4 | 1 | 1 | 1 | 0 | 0 | 1 | 0 | 1 | | | 1 | 0 | 0 | |
| 8 | 2.8 | 1 | 1 | 1 | 0 | 0 | 1 | 0 | 1 | | | 1 | 1 | 0 | |
| 9 | 3.2 | 1 | 1 | 1 | 0 | 1 | 1 | 0 | 1 | | | 1 | 1 | 0 | 00 |
| 10 | 3.6 | 1 | 1 | 1 | 0 | 1 | 1 | 0 | 1 | | | 1 | 1 | 0 | |
| 11 | 4 | 1 | 1 | 1 | 1 | 1 | 1 | 0 | 1 | | | 1 | 1 | 0 | |
| 12 | 4.4 | 1 | 1 | 1 | 1 | 1 | 1 | 1 | 1 | | | 1 | 1 | 1 | 10 |
| 13 | 4.8 | 1 | 1 | 1 | 1 | 1 | 1 | 1 | 1 | | | 1 | 1 | 1 | |
| 14 | 5.2 | 1 | 1 | 1 | 1 | 1 | 1 | 1 | 1 | | | 1 | 1 | 1 | |
| 15 | 5.6 | 1 | 1 | 1 | 1 | 1 | 1 | 1 | 1 | | | 1 | 1 | 1 | |
| 16 | 6 | 1 | 1 | 1 | 1 | 1 | 1 | 1 | 1 | | | 1 | 1 | 1 | |
| Toutput | | 0x03 | 0x04 | 0x06 | 0x0B | 0x08 | 0x07 | 0x0D | 0x03 | | | 0x04 | 0x08 | 0x0C | |
| Hard sense output | | 11 | 00 | 01 | 10 | 00 | 01 | 10 | 11 | | | | | | |

FIGURE 4

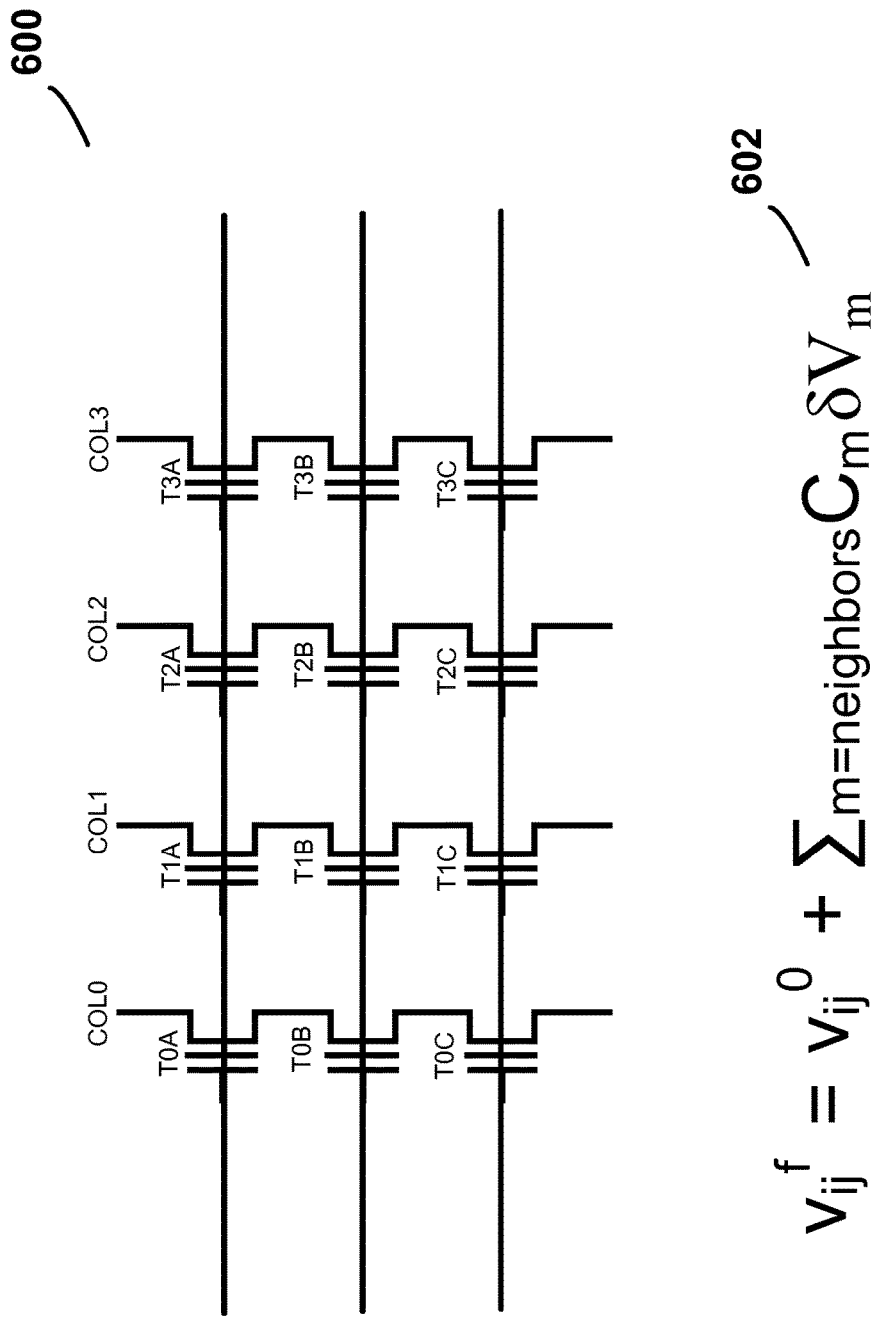

MEMORY SENSING

BACKGROUND

Unless otherwise indicated herein, the materials described in this section are not prior art to the claims in this application and are not admitted to be prior art by inclusion in this section.

Flash memory may use a threshold voltage of the memory cell (e.g., an analog quantity) to store digital data by dividing the available range of the threshold voltage into different levels. For example, the threshold voltage for a single-level cell flash memory may be divided into two levels. The threshold voltage for a multi-level cell may be divided into multiple levels (e.g., four levels, or into eight levels for triple-level flash memory). In these examples, the thresholds may be hardwired thresholds that may be assigned to define the boundaries between levels.

To read a value of a memory cell, multiple sensing operations may typically be used. For example, a read voltage may be applied to a control gate of the flash memory cell. A sense amplifier may then be used to determine if the memory cell is conducting at a particular cell threshold voltage. The sensing operations may determine and assign a digital value for each cell based on whether the cell threshold voltage is below the level threshold (conducting) or above the level threshold (cell not conducting). In some cases, the thresholds may be more adaptive with the option for multiple reads using a read-retry feature. A read retry method might be used to obtain the actual threshold voltage. Determining the actual threshold voltage, however, may take a long time.

SUMMARY

Briefly stated, technologies are generally described herein to sense the threshold voltage for memory cells in one sensing operation. The memory cells may be storage circuits for a flash memory device, such as a multi-level cell (MLC). Using the technologies described herein, information (e.g., data) may be stored and retrieved in the memory cells of the flash memory without requiring the use of hardwired or predetermined thresholds.

In one example, a method to sense digital values associated with a selected row of a flash memory is described. The method includes ramping a signal from a first value to a second value over a time. The signal may be applied to memory cells in the selected row of the flash memory. The method also includes sensing values of the memory cells in the selected row during the ramping of the signal and storing the sensed values during the ramping. Digital values for the memory cells may be determined based, at least in part, on the sensed values.

In another example, a non-volatile memory device is described. The non-volatile memory device may include an array of memory cells arranged by rows of word lines and columns of bit lines, wherein at least a portion of control gates of the memory cells are coupled to a same word line (WL) and wherein one or more sources and one or more drains of at least some of the memory cells are coupled to a same bit line (BL). The device may also include a controller coupled to the array of memory cells. The memory controller may be operative to cause a signal level to ramp between a first value and a second value over clock cycles, the signal level applied to the memory cells in a selected WL. The memory controller may also receive, at a same clock cycle, data for a plurality of individual memory cells in the selected WL, the data associated with current values for the individual memory cells and determine digital values for the individual memory cells based, at least in part, on the sensed data over the clock cycles.

In another example, a method to define storage media is described. The method may include obtaining threshold voltages from a row of memory cells, defining thresholds between digital states of the memory cells, and outputting digital data. The digital data may be output based, at least in part, on the obtained threshold voltages of the row of memory cells and the defined thresholds.

In still another example, another method to define storage media is described. The method may include obtaining one or more threshold voltages or sensing times derived from the threshold voltage from a row of memory cells. Digital states may be assigned to the memory cells based, at least in part, on the sensing times and topological constraints and outputting digital data related to the assigned digital states.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 4 is a table that illustrates example possible outcomes for sensing of a multi-level memory cell when ramping a read signal;

FIG. 6 illustrates an example of a circuit configuration that uses the analog threshold voltage to reduce cell to cell interference;

DETAILED DESCRIPTION

Figure 1:
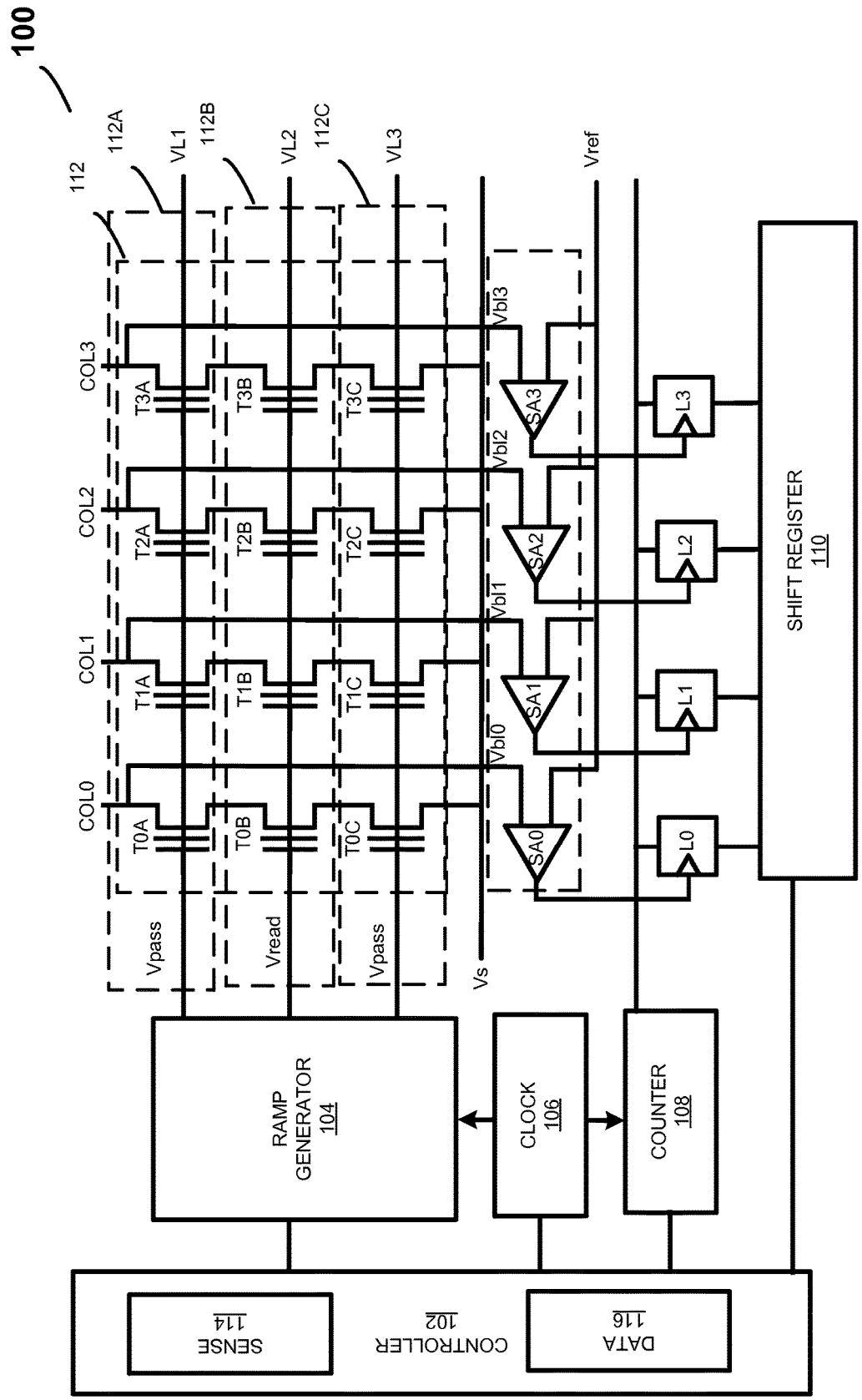
FIG. 1 is a schematic circuit diagram illustrating an example flash memory device.

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies to sense the threshold voltage for memory cells in one sensing operation. The memory cells may be storage circuits for a flash memory device, such as a multi-level cell (MLC). Using the technologies described herein, information (e.g., data) may be stored and retrieved in the memory cells of the flash memory without requiring or otherwise involving the use of hardwired or predetermined thresholds. According to some configurations, a sensing mechanism may determine threshold voltage levels for memory cells of a flash memory using the values of the memory cells at different sensing times of the memory cells during the sensing operation. In some examples, the distribution of the values obtained for the memory cells within a word line (e.g., one row) during the sensing operation may be processed to decode the digital state of each cell. In some cases, software may be used to process and decode the digital state of the memory cells.

The decoding mechanism may use topological constraints, in contrast to rigid or predetermined thresholds, to digitize the distribution. The sensing mechanism described herein might be used with error-correcting code (ECC) mechanisms. Since topological constraints may be utilized, as opposed to the predetermined thresholds, there may be greater flexibility for allocating memory cells to almost arbitrary digital states. Additionally, the sensing mechanism described herein may not require or otherwise involve a precision voltage standard and the associated design complexity that is used by many traditional flash memories.

FIG. 1 is a schematic circuit diagram illustrating an example flash memory device 100 that is arranged in accordance with at least some embodiments described herein. As illustrated, the device 100 may include a controller 102, a ramp generator 104, a clock 106, a counter 108, a shift register 110, sense amplifiers SA0-SA3, latches L0-L3, and a memory array 112 that includes memory storage circuits (e.g., "memory cells").

The controller 102 may be coupled to the ramp generator 104, the clock 106, the counter 108, the shift register 110, the sense amplifiers SA0-SA3 (e.g., a sense circuit), the latches L0-L3, and the memory array 112. As illustrated in FIG. 1, each of the sense amplifiers SA0-SA3 may be coupled to one of the bitlines $V_{bl0}$-$V_{bl3}$. Input terminals of latches L0-L3 may be coupled to a respective output terminal of sense amplifiers SA0-SA3. The latches L0-L3 may also be coupled to a counter 108.

As illustrated, the transistors may be arranged in rows 112A-112C and columns COL0-COL3. In some configurations, the device 100 may include at least two or more memory columns and two or more memory rows. As illustrated, the device 100 may include columns COL0-COL3. In the current example, COL0 may include transistors T0A-T0C that may be arranged in series. For example, transistor T0A may include a control terminal coupled to a first voltage line, such as VL1, a first terminal coupled to a first bitline $V_{bl0}$ and a second terminal coupled to a first terminal of transistor T0B. Transistor T0B may include a control terminal coupled to a second voltage line, such as VL2, a first terminal coupled to a second terminal of transistor T0A and a second terminal coupled to a first terminal of transistor T0C. Transistor T0C may include a control terminal coupled to a third voltage line, such as VL3, a first terminal coupled to a second terminal of transistor T0B and a second terminal coupled to a voltage line $V_s$. The COL1 transistors T1A-T1C may be similarly configured to transistors T0A-T0C. The COL2 transistors T2A-T2C may be similarly configured to transistors T0A-T0C. The COL3 transistors T3A-T3C may be similarly configured to transistors T0A-T0C.

Various types of transistors may be used. The following disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

The following description describes one or more examples of sensing the threshold voltage for the memory cells in a word line, such as the word line 112B. In the example illustrated in FIG. 1, the value for the word line 112B that includes transistors T0B, T1B, T2B and T3B may be sensed in one sensing operation. Generally, a sense mechanism 114 that may be utilized by the controller 102 may maintain data 116 relating to the sensing of each of the memory cells within the word line 112B. For example, the controller 102 may maintain a count of the pulses of a reference clock, such as the clock 106. At the end of the sensing operation, the controller 102 may use the data 116 obtained during the sensing operation to determine the value for the word line 112B.

At the beginning of the evaluation period, the controller 102 may set a read signal, such as a voltage Vread, at VL2 to a specified value and a pass signal, such as a voltage Vpass at VL1 and VL3. According to some examples, voltage Vpass that is applied to the VL1 and VL3 voltage may be set to a value such that the transistors T0A-T3A and T0C-T3C on the rows not currently being sensed (e.g., the unselected rows) to be activated (e.g., turn on).

The controller 102 may instruct the ramp generator 104 to begin ramping the Vread signal from a first value to a second value. For example, the ramp generator 104 may be instructed to ramp a signal (e.g., a voltage) either up in value or down in value. According to some configurations, the controller 102 may cause the ramp generator 104 to ramp the voltage up in value.

As the signal that is provided to the control terminals of the transistors T0A-T0C ramps, the counter 108 may count the clock pulses produced by the clock 106 and may store the data 116. For example, the data 116 may include timing data and values of the memory cells such as Vread at different points in time. At some point during the ramping of Vread, each of the transistors T0B-T3B may turn on and start to discharge the respective bitline, or possibly a dedicated capacitor in an all-bit line architecture may start to discharge (not shown). In some configurations, some memory cells (e.g., transistors) within the word line 112B may turn on and start to discharge in response to the read voltage applied to the control terminals of the transistors T0B-T3B within the same row. For example, a memory cell that is "erased" and has a negative Vt may turn on when the read voltage is initially applied to the control terminals.

As the ramp generator 104 ramps the read voltage in response to different clock cycles produced by the clock 106, other bitlines associated with different columns in the memory array may start to discharge. As the bitline voltage of a particular bitline decreases to a trip point (Vref) associated with the respective sense amplifier, the output of the sense amplifier SA may change and trigger the data latch L on the corresponding column to latch the counter output at the trip time of the column. This latched data 116 may be streamed out to the controller 102, or some other circuit, during the evaluation cycle. The latched data 116 may also be streamed out to the controller 102 at some other time. For example, the latched data 116 may be streamed out at the end of the evaluation cycle.

Figure 3:
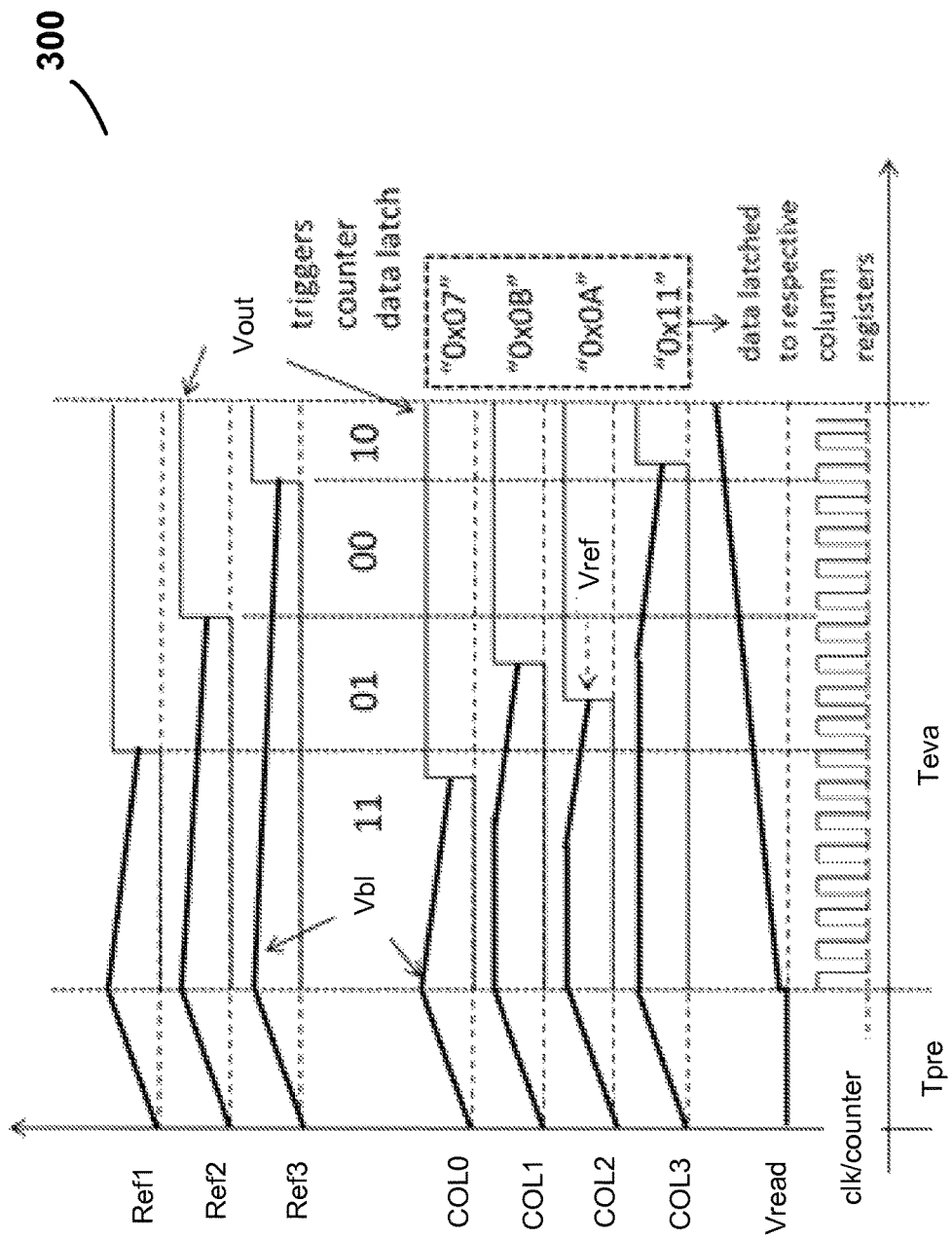
FIG. 3 is a timing diagram illustrating an example of the sensing of memory cells to determine threshold values.

The controller 102 may use the received data 116 of each cell that is measured in terms of clock cycle of the reference clock 106. An example timing diagram associated with the current example illustrated by FIG. 1 may be seen in FIG. 3. For example, FIG. 3 shows example data 0x07, 0x0B, 0x0A, and 0x11 for COL0-COL3 for the example illustrated in FIG. 1. In some configurations, the data 116 may be logged to the associated column multi-bit register by the counter 108. In other configurations, an analog-to-digital (ADC) converter (not shown) may be used to convert the wordline voltage to digital output at the time of sense amplifier tripping. In another configuration, the counter 108 and clock 106 may be replaced by other circuits, for example, an analog to digital converter (ADC). In this case, the data latched to each latch may be the read voltage Vread at the point where the respective sense amplifier is triggered.

Figure 2:
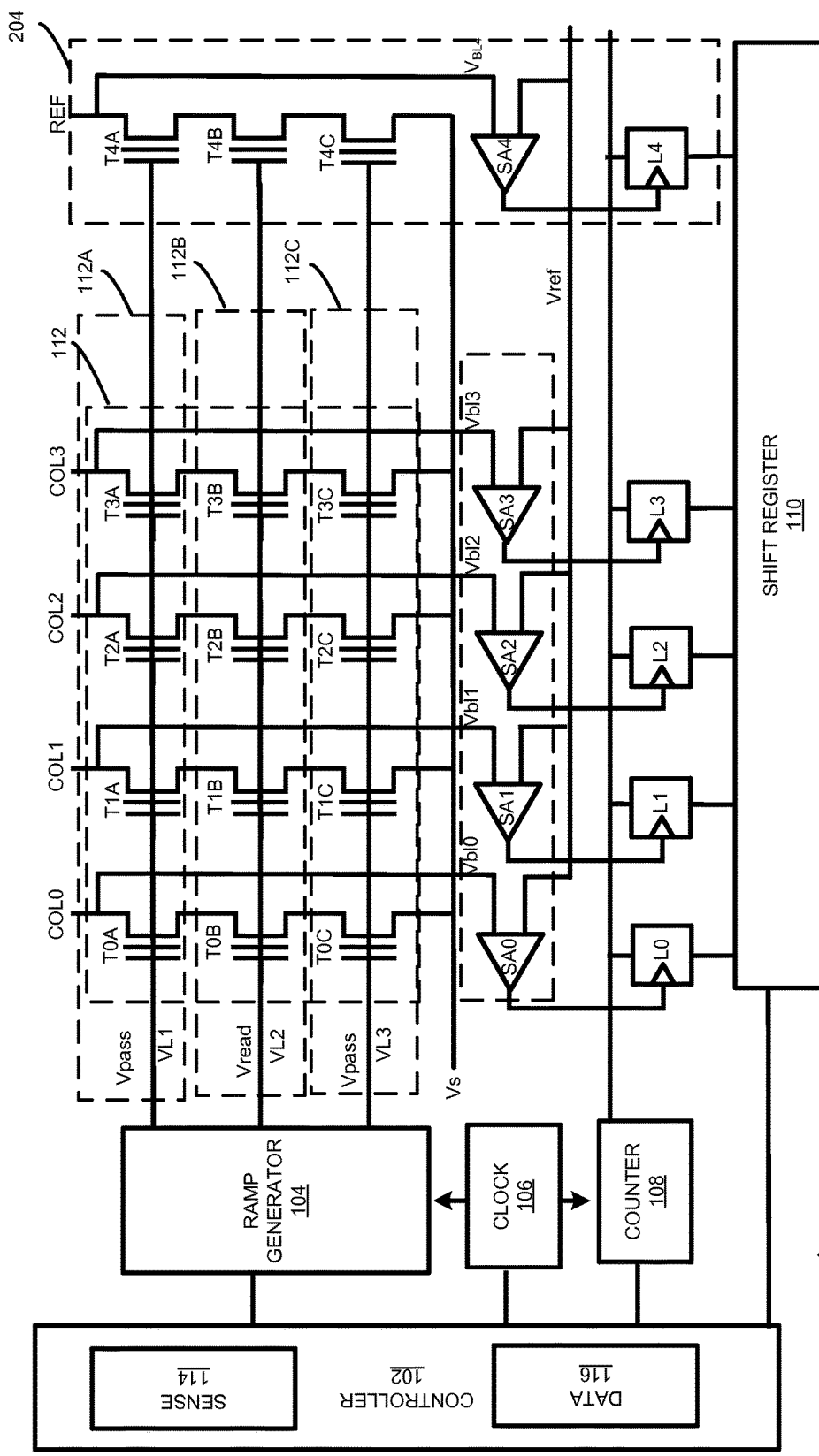
FIG. 2 is a schematic circuit diagram illustrating an example flash memory device that includes reference memory cells.

FIG. 2 is a schematic circuit diagram illustrating an example flash memory device 100 that includes reference memory cells that are arranged in accordance with at least some embodiments described herein. As illustrated, the device 200 may be similar to the device 100 of FIG. 1 but includes reference column 204 coupled to the various other components of the device 200. The reference column 204 may include one or more reference memory cells, such as reference transistors T4A-T4C. The reference transistors T4A-T4C may be similarly configured to transistors T0A-T0C.

In some configurations, the reference cells illustrated in the reference column 204 may be used to determine an actual threshold voltage value for the memory cells in a word line as compared to estimated values. In some configurations, the threshold voltage of the reference cells may be set at different threshold levels (e.g., 0.8V, 2.5V, 4.2V, etc.) associated with the multi-level cell being sensed. The controller 102 may use the reference cells to sense the digital state of the cell directly. The exemplary table illustrated in FIG. 4 illustrates the use of the reference cells.

FIG. 3 is a timing diagram 300 illustrating an example of the sensing of memory cells to determine threshold values, in accordance with at least some embodiments described herein. As illustrated, the timing diagram 300 includes a plot for the values of the reference cells, the columns COL0-COL3, an example Vread signal being ramped and an example clock output.

The Tpre portion of the timing diagram 300 illustrates a pre-charging operation that may be used to set the transistors on the unselected rows to turn on. After the pre-charge operation, the controller 102 may ramp the Vread signal (e.g., a read voltage or read signal) from a first value (e.g., 0) to a final voltage (e.g., Vpass) on the selected word line (e.g., row). During the ramping of the Vread signal, the controller may store the timing data received from at least a portion of the clock cycles (e.g., each clock cycle, every $2^{nd}$ clock cycle, or the like) that may be used to determine the value of the word line. For example, the timing data may be analyzed using interpolation or extrapolation mechanisms to obtain the threshold voltage values for the cells in the sensed row. In other examples, the reference memory cells may be used to determine the value of the word line. For example, the cell timing data may be compared to the reference cell data.

The clock frequency and number of cycles may be adjusted. For example, in order to finish one sensing cycle in 10 us with accuracy of 16 levels, the clock frequency may be set to 16/10 us=1.6 MHz. In this configuration, 16 pulses and 16 pages of data may be streamed out in one sensing cycle. In some configurations, data compression may be used to increase the data rate.

FIG. 4 is a table 400 that illustrates example possible outcomes for sensing of a multi-level memory cell when ramping a read signal, in accordance with at least some embodiments described herein. For example, the multi-level memory cell may be a 4-level 2 bit/cell MLC cell, with levels of "00", "01", "11", "10" as illustrated in FIG. 1 and/or FIG. 2.

Table 400 illustrates the use of three reference levels that may be used to define the state of the flash cell. The digital output, after each clock cycle, from the sense amplifiers from the three reference cells and 8-memory cells are listed with the 16 clock cycles that are in one sensing period. As illustrated in table 400, column 1 lists the clock cycle and column 2 lists the wordline ramping voltage (Vread). Column 3-10 correspond to the output of the memory cells that are sensed. In this example, column 3 flips at the clk cycle#3, which is below the threshold for the second level. Since this cell is below the threshold for the second level, the cell may be placed into the state (11). Similarly column 4 flips at clk cycle#11 indicating that the memory cell in the word line being sensed corresponds to state (00). Columns 11-13 (the reference column Vout columns) list the output of the reference columns. For example, at clock cycle 4, reference column 1 changes from 0 to 1, indicating the reference cell threshold voltage has been reached and triggers the corresponding sense amplifier SA4 to latch. This level sets the threshold for the 2nd level (corresponding to state 01, listed on the right most column) As described herein, the sensing of the complete state of all the memory cells on one word line may be performed in one sensing cycle. Similar analysis may be performed for 3, 4, 5 or more bits per cell.

Figure 5B:
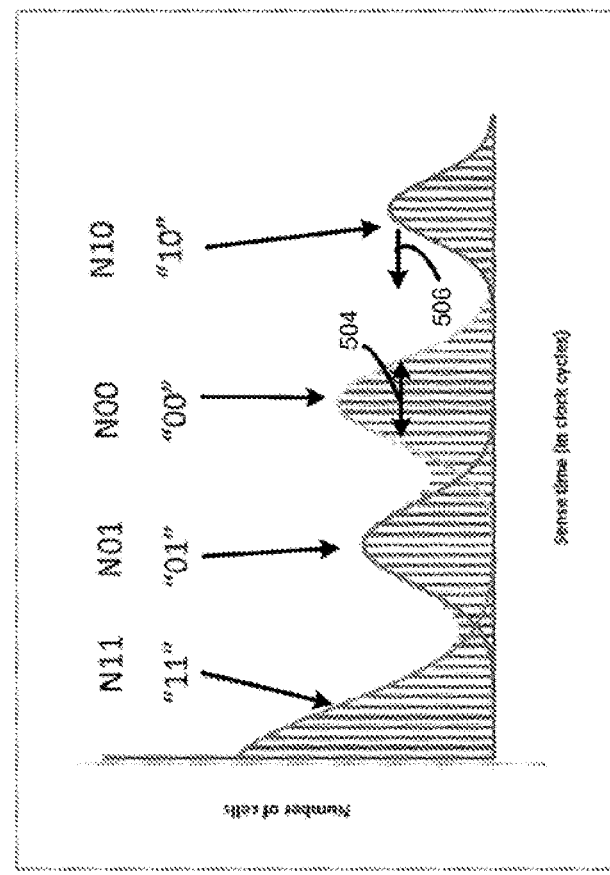
FIG. 5A and FIG. 5B are graphs illustrating example sensing and assignment of memory cells within a row of a memory device.
Figure 5A:
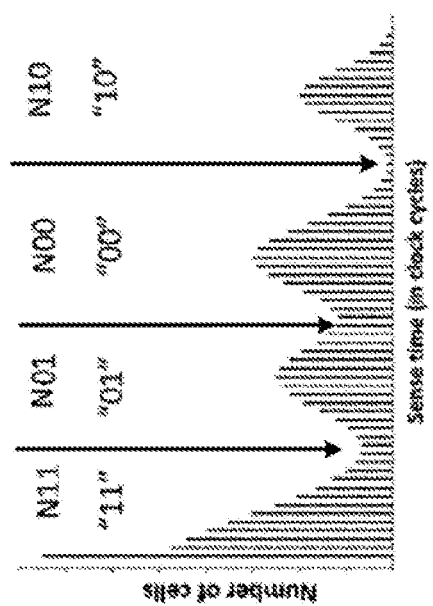

FIG. 5A and FIG. 5B are graphs illustrating example sensing and assignment of memory cells within a row of a memory device, in accordance with at least some embodiments described herein. As illustrated, FIG. 5A shows a graph that plots a histogram of example sensed values of memory cells as a function of the sense time. For example, individual vertical bars in the graphs illustrated in FIGS. 5A and 5B show a value of the number of memory cells that are turned on at a clock cycle. In the current example, the distributions are spread out to simulate effects of transistor mismatch that may be due in part to process variation, random telegraph noise, programing/erase cycle induced oxide damage, cell to cell interference, and the like. The distribution may be different in other examples. As discussed above, the sensing mechanism described herein may be used with many different memory cells that include many different types of transistors or other type of storage circuits.

FIG. 5B shows example assignment of the digital state for each of the memory cells. Different mechanisms might be used to assign a digital state to a memory cell. In the current example, a boundary is assigned between the digital states at a minimum of the distributions, as shown by the vertical arrows that are used to separate the different levels of the memory device. In contrast to existing methods of determining levels of a memory device that use predefined thresholds, the current thresholds may not be defined prior to the sensing of the memory cells. In some configurations, the sensing may be performed utilizing a software program. As such, the sensing may be more flexible as compared to traditional sensing techniques and might be more easily adapted to work with error-correcting code (ECC) memory methods, such as low-density parity-check (LDPC).

The vertical bars in the graphs illustrated in FIGS. 5A and 5B indicate possible level boundaries that are used to digitize this distribution. Based at least in part on the topological nature of the assignment methods, expansion, shrinking, or shifting of the level distribution within memory cells may not affect the outcome of the cell assignment within a multi-level cell.

Another mechanism that might be used to determine levels of a multi-bit memory cell might be to use a counting mechanism. The counting mechanism may not utilize thresholds between different states. Instead, topological constraints may be stored when the rows are programmed. For example, during programming, the number of cells with "11", "01", "00", and "10" states (e.g., N11, N01, N00, N10) may be counted and stored. During a sensing cycle, the number of cells may be counted from the lowest Vt (normally the erased state). The first N11 cells may be assigned to the "11" states, the next N01 cells may be assigned "01" states, the next N00 memory cells may be assigned to the "00" states, and the next N10 memory cells may be assigned to the "10" states.

According to other configurations, the overall distribution of the levels might be fit by known or approximate cell distributions. For example, Gaussian distributions including a retention model might be utilized. The memory cells that fall into different distributions may belong to the different digital states of the multi-level memory storage circuit. The metadata, number of cells in each level, and/or other factors can be used as the constraints in the fit.

For the memory cells at the level boundary, a maximum likelihood mechanism might be used for the assignment of the cells. As illustrated, the sensing mechanisms may be topological in nature in the sense that the distribution may expand or shrink, as indicated by the arrow 504 in FIG. 5B, or shift, as indicated by the arrow 506 in FIG. 5B.

In other embodiments, error correction codes maybe used in combination with the level assignment methods discussed above to resolve the correct level for each cell.

With the optional reference cells, or through characterization of threshold voltage and sense time, the actual threshold voltage of each cell can be obtained. After the threshold voltage values for a cell and the threshold voltage values of its surrounding cells are known, the shift of the threshold voltage due to the cell to cell interference can be determined by using cell to cell interference models.

Since the level assignment may be done in software in one embodiment, this feature greatly increases the flexibility. The sensing time or voltage data (or Vt data if reference cells are used) from a flash row can be manipulated and interpreted in software. In some configurations, each row may be software definable as single level cell (SLC), multilevel cell (MLC), triple level cell (TLC), or the like. For example, one row of the flash memory may be selected to be an MLC row and another row to be a TLC row. A row might be a MLC one day and redefined to be a TLC row another day. One row may even contain sections of SLC, MLC, or TLC cells. For example the first half of the row may be a SLC set, while the second half can be TLC cells.

With the sensing mechanism described herein, the programming of memory cells may be more flexible as compared to traditional sensing mechanisms for flash memory. To maintain data integrity between sensing operations, the programming may use the same or substantially similarly method that may utilize a consistent topological order for the programmed cells. For example, for MLC, the "01" cells may have a longer sensing time compared to the "11" cells. Similarly, the "00" cells may have a longer sensing time compared to the "01" cells. One example is method is to use a program-verify process and the program verify threshold in the present flash memory. Another programming method, starting with an erase population, may be to measure the erase population and use the longest sense time as the verify threshold for programming the "01" cells, etc.

During programming of the memory cell, metadata may be stored, e.g., number of cells in each state and the cell to cell interference parameters. The pre-interference data may be stored and used to extract the interference parameters after all the cells are programmed. The thresholds may be software adjusted, depending on SLC/MLC/TLC, or changes with time using retention models.

FIG. 6 illustrates an example of a circuit configuration 600 that uses the analog threshold voltage to reduce cell to cell interference, in accordance with at least some embodiments described herein. Once the threshold voltage values for a cell and the threshold voltage values of its surrounding cells are known, the shift of the threshold voltage due to the cell to cell interference may be determined by using cell to cell interference models, as illustrated in FIG. 6 and equation 602. As illustrated, an example of the equation may be: $v_{ij}^f = v_{ij}^0 + \Sigma_{m=neighbors} C_m \delta V_m$ where $v_{ij}^0$ and $v_{ij}^f$ is the threshold voltage of the victim cell before and after the neighborhood cells are programmed $\delta V_m = v_m^f - v_m^0$ is the change of threshold voltage of an interfering cell m before $(v_m^0)$ and after $(v_m^f)$ the cells are programmed. $C_m$ is the coupling coefficient that can be derived and stored, and used during read to remove/reduce the interference effect.

In one process, the sensing timing or voltage of a row of cells may be stored. After the neighboring row or rows are programmed, the sensing time or voltage may be measured again. The change can be used to extract the cell to cell interference effect, for example, the coupling coefficients in equation 602. These coupling coefficients can be stored and used during the read operation. With the knowledge of threshold voltage for the cells in a multi-level cell, the memory be used as a software definable storage medium.

Figure 7:
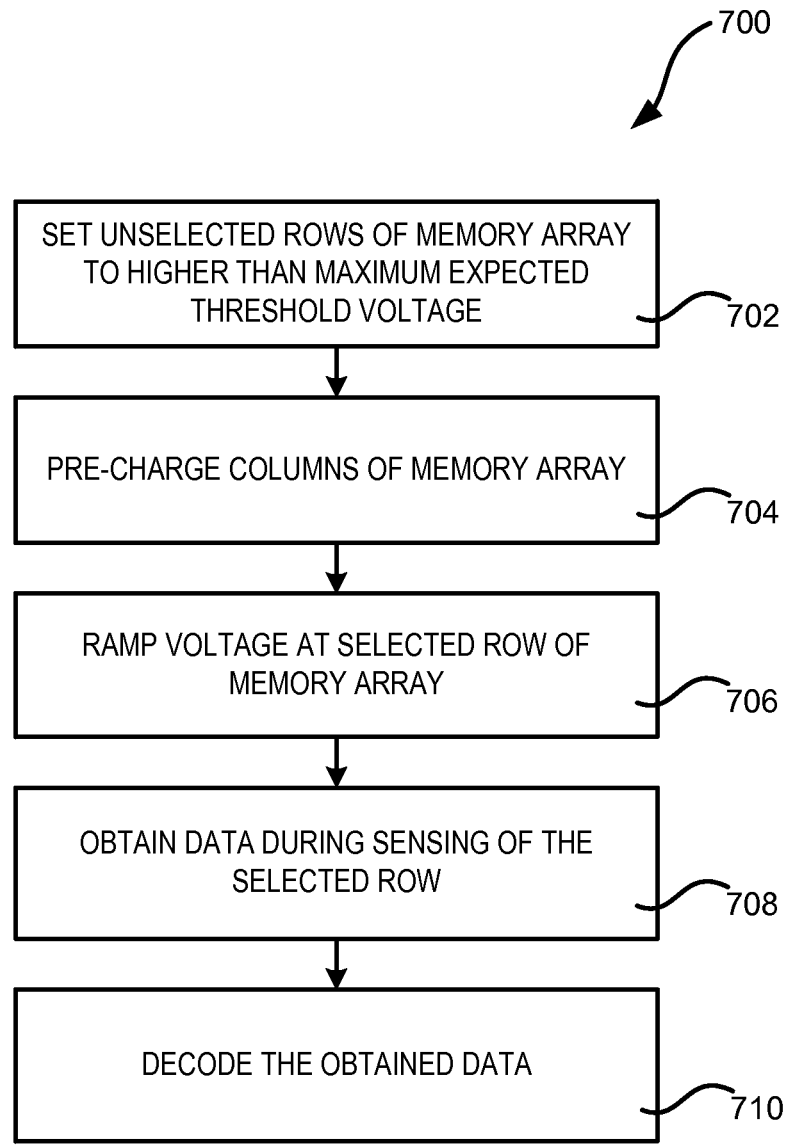
FIG. 7 is a flow diagram respectively illustrating an example process to perform a sensing operation.

FIG. 7 is a flow diagram respectively illustrating an example process to perform a sensing operation, in accordance with at least some embodiments described herein. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like. For purposes of illustrating and describing the concepts of the present disclosure, the process 700 is described as being performed, at least in part, by one or more components of the computing device 800 of FIG. 8. This embodiment is illustrative, and the processes may be performed in other ways using other device(s) or component(s) thereof.

The process 700 may begin at block 702 ("set unselected rows of memory array to higher than maximum expected threshold voltage"), where the unselected rows of the memory array 112 are set to a higher than maximum expected threshold value. As discussed above, the controller 102 may be configured to set or control the setting of the unselected rows to a value (e.g., Vpass) such that the memory storage circuits (e.g., transistors) turn on.

The process 700 may continue to block 704 ("pre-charge columns of memory array"), where the columns of the memory array 112 may be pre-charged. As discussed above, the controller 102 may be configured to pre-charge or control the pre-charge of the columns of the memory array 112.

The process 700 may continue to block 706 ("ramp voltage at selected row of memory array"), where the voltage is ramped at the selected row of the memory array that is being sensed. As discussed above, the controller 102 may instruct the ramp generator 104 to ramp the signal level, such as a voltage level, from a first value (e.g., 0) to a second level (e.g., Vpass). The signal may be ramped in response to a new clock cycle or in response to some other event or condition.

The process 700 may continue to block 708 ("obtain data during sensing of the selected row"), where data is obtained during the sensing of the memory row. As discussed above, the controller 102 may be configured to receive the data 116 at the end of the sensing operation or during the sensing operation.

The process 700 may continue to block 710 ("decode the obtained data"), where the data may be decoded. As discussed above, the controller 102 may decode the data 116 to determine a value of the memory cells in the selected row. In some examples, the controller 102 may perform a "soft sensing." For instance, the controller 102 may utilize interpolation or extrapolation models to obtain the threshold voltage values for all the cells in the sensed row. In other examples, the controller 102 may perform a "hard decoding." For instance, the controller 102 may compare the cell timing data to the reference cell data when reference memory cells are utilized. The process 700 may thereafter end or return to perform some other operation. For example, the process 700 might return to block 702 to begin a sensing operation for another row.

Figure 8:
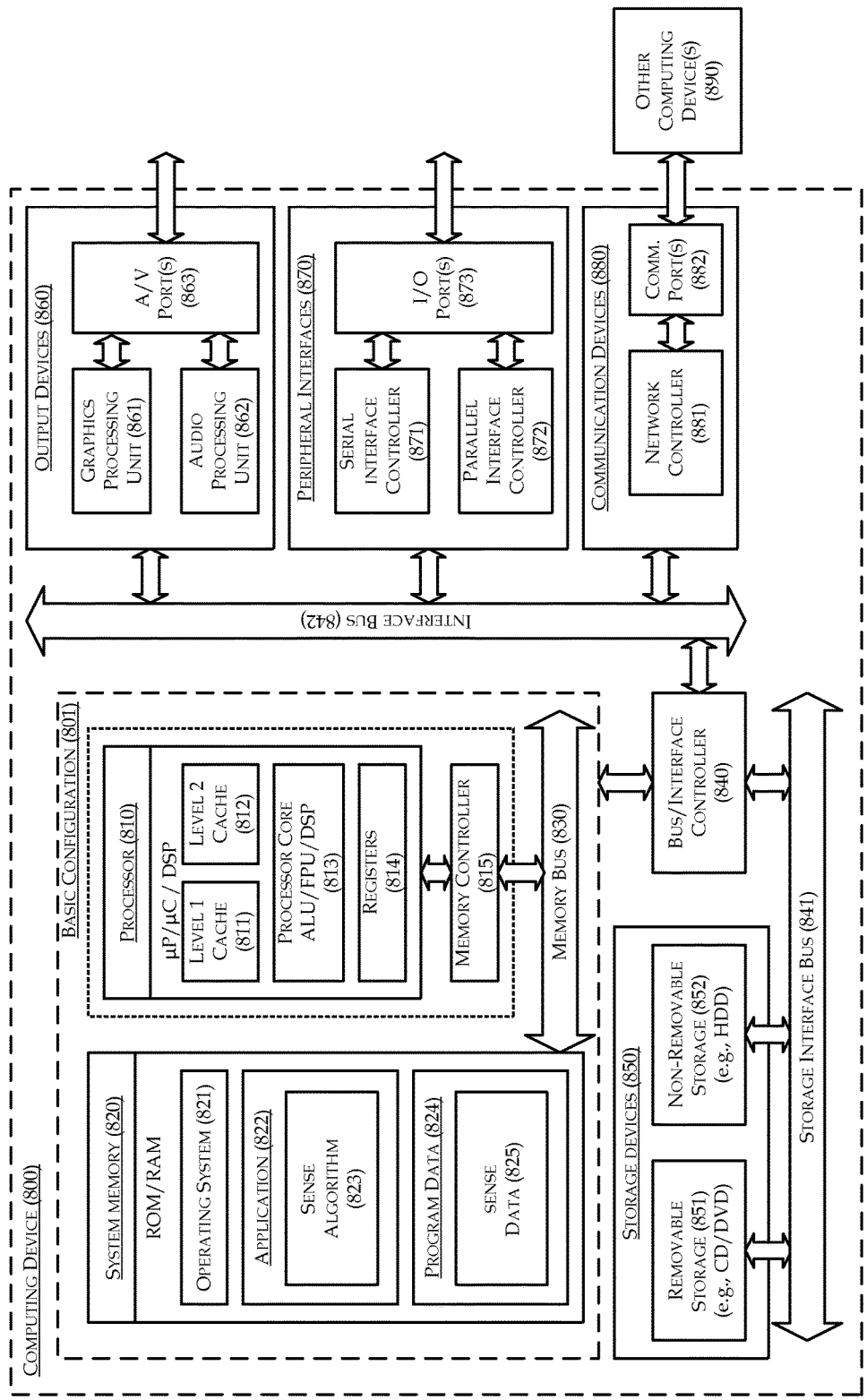
FIG. 8 is a block diagram illustrating an example computing device that is arranged to perform a sensing operation, all arranged according to at least some embodiments presented herein.

FIG. 8 is a block diagram illustrating an example computing device 800 that is arranged to perform a sense operation, in accordance with at least some embodiments described herein. In a very basic configuration 801, computing device 800 typically includes one or more processors 810 and system memory 820. A memory bus 830 can be used for communicating between the processor 810 and the system memory 820. According to some configurations, the system memory 820, or other memory depicted in FIG. 8 may be the memory array 112.

Depending on the desired configuration, processor 810 can be of any type including but not limited to a microprocessor (µP), a microcontroller (µC), a digital signal processor (DSP), or any combination thereof. Processor 810 can include one or more levels of caching, such as a level one cache 811 and a level two cache 812, a processor core 813, and registers 814. The processor core 813 can include an arithmetic logic unit (ALU), a floating point unit (FPU), a digital signal processing core (DSP core), or any combination thereof. A memory controller 815 can also be used with the processor 810, or in some implementations, the memory controller 815 can be an internal part of the processor 810. In some examples, the memory controller 815 may be used as the controller 102 illustrated in FIG. 1 and FIG. 2.

Depending on the desired configuration, the system memory 820 can be of any type including but not limited to volatile memory (such as RAM), non-volatile memory (such as ROM, flash memory, etc.) or any combination thereof. System memory 820 typically includes an operating system 821, one or more applications 822, and program data 824. Application 822 includes a sense algorithm 823 that is arranged to implement or operate a sense mechanism as described herein. Program Data 824 includes sense data 825 that is useful for determining values of a memory cell from a single sense operation.

Computing device 800 can have additional features or functionality, and additional interfaces to facilitate communications between the basic configuration 801 and any required devices and interfaces. For example, a bus/interface controller 840 can be used to facilitate communications between the basic configuration 801 and one or more data storage devices 850 via a storage interface bus 841. The data storage devices 850 can be removable storage devices 851, non-removable storage devices 852, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 820, removable storage 851 and non-removable storage 852 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 800. Any such computer storage media can be part of computing device 800.

Computing device 800 can also include an interface bus 842 for facilitating communication from various interface devices (e.g., output interfaces, peripheral interfaces, and communication interfaces) to the basic configuration 801 via the bus/interface controller 840. Example output devices 860 include a graphics processing unit 861 and an audio processing unit 862, which can be configured to communicate to various external devices such as a display or speakers via one or more A/V ports 863. Example peripheral interfaces 870 include a serial interface controller 871 or a parallel interface controller 872, which can be configured to communicate with external devices such as input devices (e.g., keyboard, mouse, pen, voice input device, touch input device, etc.) or other peripheral devices (e.g., printer, scanner, etc.) via one or more I/O ports 873. An example communication device 880 includes a network controller 881, which can be arranged to facilitate communications with one or more other computing devices 890 over a network communication via one or more communication ports 882. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 800 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general, such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A non-volatile memory device, comprising:
   an array of memory cells arranged by rows of word lines and columns of bit lines, wherein at least a portion of control gates of the memory cells are coupled to a same word line (WL), and wherein one or more sources and one or more drains of at least some of the memory cells are coupled to a same bit line (BL);
   a controller operatively coupled to the array of memory cells, wherein the controller is configured to:
      cause a signal level to ramp between a first value and a second value over clock cycles, wherein the signal level is applied to the memory cells in a selected WL;
      receive, at a same clock cycle, data for a plurality of individual memory cells in the selected WL, wherein the received data is associated with current values for the plurality of individual memory cells; and
      determine digital values for the plurality of individual memory cells based, at least in part, on the received data over the clock cycles,
      wherein to determine the digital values, the controller is configured to compare memory cell timing data to reference cell data;
   a sense circuit operatively coupled to the array of memory cells and to the controller; and
   a shift register operatively coupled to an output terminal of the sense circuit,
   wherein the shift register is configured to output the data to the controller,
   wherein the controller is configured to decode the received data by use of one or more of hard decoding or soft decoding,
   wherein thresholds are defined between digital states of the memory cells, and
   wherein the controller is further configured to adjust the thresholds according to a data retention model of the memory cells and according to a cell to cell interference model of the memory cells.

2. The non-volatile memory device of claim 1, further comprising reference cells operatively coupled to the array of memory cells, wherein the reference cells comprise a first reference cell configured to be set to a first reference threshold value, a second reference cell configured to be set to a second reference threshold value, and a third reference cell configured to be set to a third reference threshold value.

3. The non-volatile memory device of claim 1, wherein each of the memory cells comprises a control gate, a floating gate, a source, and a drain, wherein the control gate is coupled to the selected WL, and wherein the source and the drain are coupled to a first BL.

4. A method to define storage media, the method comprising:
   obtaining threshold voltages from a row of memory cells during a sensing cycle;
   defining thresholds between digital states of the memory cells by assigning boundaries between the digital states based on a number of memory cells that are turned on during the sensing cycle; and
   outputting digital data based, at least in part, on the obtained threshold voltages from the row of the memory cells and the defined thresholds.

5. The method of claim 4, further comprising adjusting the thresholds according to a data retention model of the memory cells.

6. The method of claim 4, further comprising adjusting the threshold voltages according to a cell to cell interference model of the memory cells.

7. The method of claim 4, wherein defining the thresholds between the digital states of the memory cells comprises defining the thresholds based, at least in part, on a number of single level cells (SLCs), multilevel cells (MLCs), and triple level cells (TLCs) in each row of the memory cells.

8. The method of claim 4, wherein defining the thresholds includes defining the thresholds to be at least one of: between 0 and 1 for binary data, between four digital states of two bit data, or between digital states of n-bit data, wherein n>2.

9. A method to define storage media, the method comprising:
   obtaining one or more sensing times, derived from a threshold voltage, from a row of memory cells;
   assigning digital states to the memory cells based, at least in part, on the one or more sensing times and topological constraints, wherein the topological constraints comprise a number of the memory cells that belong to individual levels associated with the digital states; and
   outputting digital data related to the assigned digital states.

10. The method of claim 9, wherein assigning the digital states to the memory cells comprises one or more of removing a cell to cell interference effect, and reducing the cell to cell interference effect.

11. The method of claim 9, wherein obtaining the one or more sensing times comprises determining sensing times for single level cells (SLCs), multilevel cells (MLC), and triple level cells (TLCs) in each row of the memory cells based on threshold voltages for the SLCs, the MLCs, and the TLCs in each row of the memory cells.

12. A non-transitory computer-readable storage medium including instructions stored thereon, that in response to execution by a processor, cause the processor to perform or control performance of the method of claim 4.

13. A non-transitory computer-readable storage medium including instructions stored thereon, that in response to execution by a processor, cause the processor to perform or control performance of the method of claim 9.

14. A method to define storage media, the method comprising:
   obtaining one or more sensing times, derived from a threshold voltage, from a row of memory cells;
   assigning digital states to the memory cells by one or more of removing a cell to cell interference effect and reducing the cell to cell interference effect based, at least in part, on the one or more sensing times and topological constraints; and
   outputting digital data related to the assigned digital states.

15. The method of claim 14, wherein obtaining the one or more sensing times comprises determining sensing times for single level cells (SLC), multilevel cells (MLC), and triple level cells (TLCs) in each row of the memory cells based on threshold voltages for the SLCs, the MLCs, and the TLCs in each row of the memory cells.

16. The method of claim 14, wherein assigning the digital states to the memory cells comprises comparing a charge time of a capacitance controlled by the memory cells in a selected row with reference timing signals.

17. The method of claim 14, wherein assigning the digital states to the memory cells comprises comparing a discharge time of a capacitance controlled by the memory cells in a selected row with reference timing signals.

18. The method of claim 14, wherein assigning the digital states to the memory cells comprises fitting a distribution of levels of the memory cells based on a Gaussian distribution.

* * * * *

UNITED STATES PATENT AND TRADEMARK OFFICE
CERTIFICATE OF CORRECTION

PATENT NO. : 9,824,750 B2  
APPLICATION NO. : 14/630644  
DATED : November 21, 2017  
INVENTOR(S) : Ma Page 1 of 1

It is certified that error appears in the above-identified patent and that said Letters Patent is hereby corrected as shown below:

In the Claims

In Column 14, Line 37, in Claim 11, delete "(MLC)," and insert -- (MLCs), --, therefor.

In Column 14, Line 62, in Claim 15, delete "(SLC)," and insert -- (SLCs), --, therefor.

In Column 14, Line 62, in Claim 15, delete "(MLC)," and insert -- (MLCs), --, therefor.

Signed and Sealed this  
Seventeenth Day of April, 2018

Andrei Iancu  
*Director of the United States Patent and Trademark Office*